United States Patent
Wu et al.

(10) Patent No.: US 10,396,725 B2
(45) Date of Patent: Aug. 27, 2019

(54) AMPLIFIER AND RESET METHOD THEREOF

(71) Applicant: Realtek Semiconductor Corporation, Hsinchu (TW)

(72) Inventors: Chien-Ming Wu, Hsinchu County (TW); Liang-Huan Lei, Kaohsiung (TW); Shih-Hsiung Huang, Miaoli County (TW); Chih-Lung Chen, Hsinchu County (TW)

(73) Assignee: REALTEK SEMICONDUCTOR CORPORATION, Hsinchu (TW)

( * ) Notice: Subject to any disclaimer, the term of this patent is extended or adjusted under 35 U.S.C. 154(b) by 0 days.

(21) Appl. No.: 15/867,676

(22) Filed: Jan. 10, 2018

(65) Prior Publication Data
US 2019/0074800 A1    Mar. 7, 2019

(30) Foreign Application Priority Data
Sep. 5, 2017    (TW) .............................. 106130334 A

(51) Int. Cl.
*H03F 1/34*    (2006.01)
*H03F 3/00*    (2006.01)
(Continued)

(52) U.S. Cl.
CPC .............. *H03F 3/005* (2013.01); *H03F 1/42* (2013.01); *H03F 1/483* (2013.01);
(Continued)

(58) Field of Classification Search
CPC ..................................... H03F 1/34; H03F 3/45
(Continued)

(56) References Cited

U.S. PATENT DOCUMENTS 8,497,746 B2 *  7/2013  Visconti ............... H03H 11/126
                                                    327/337
8,947,289 B2    2/2015  Yang et al.
(Continued)

FOREIGN PATENT DOCUMENTS

TW         200729699 A      8/2007

OTHER PUBLICATIONS

Yuan-Ching Lien., "A 14.6mW 12b 800MS/s 4xTime-Interleaved Pipelined SAR ADC achieving 60.8dB SNDR with Nyquist input and sampling timing skew of 60fsrms without calibration"., 2016 IEEE, Symposium on VLSI Circuits Digest of Technical Papers., p. 156-157.

*Primary Examiner* — Henry Choe
(74) *Attorney, Agent, or Firm* — CKC & Partners Co., LLC

(57) ABSTRACT

An amplifier includes an output stage circuit and a compensation circuit. The output stage circuit includes a first input terminal, a second input terminal, a first output terminal, and a second output terminal. The compensation circuit includes a first capacitor, a second capacitor, a third capacitor, and a fourth capacitor. The first capacitor is coupled between the first input terminal and the second output terminal, and is configured to operate as a first Miller capacitor. The second capacitor is coupled between the second input terminal and the first output terminal, and is configured to operate as a second Miller capacitor. The third capacitor and the fourth capacitor are configured to alternately operate as the first Miller capacitor and the second Miller capacitor according to at least one clock signal.

20 Claims, 8 Drawing Sheets

(51) Int. Cl.
  *H03F 1/42*    (2006.01)
  *H03F 1/48*    (2006.01)
  *H03F 3/45*    (2006.01)
  *H03M 1/12*    (2006.01)

(52) U.S. Cl.
  CPC ... *H03F 3/45385* (2013.01); *H03F 2200/153* (2013.01); *H03F 2200/156* (2013.01); *H03F 2200/36* (2013.01); *H03M 1/1245* (2013.01)

(58) Field of Classification Search
  USPC .............................. 330/294, 260, 253, 261
  See application file for complete search history.

(56) References Cited

U.S. PATENT DOCUMENTS

| | | | |
|---|---|---|---|
| 9,160,360 B1 | 10/2015 | Lien | |
| 9,521,342 B2* | 12/2016 | Mesgarani | H04N 5/3745 |
| 2013/0285767 A1* | 10/2013 | Visconti | H03H 19/004 |
| | | | 333/173 |
| 2017/0187335 A1* | 6/2017 | Nicollini | H03F 3/45475 |

* cited by examiner

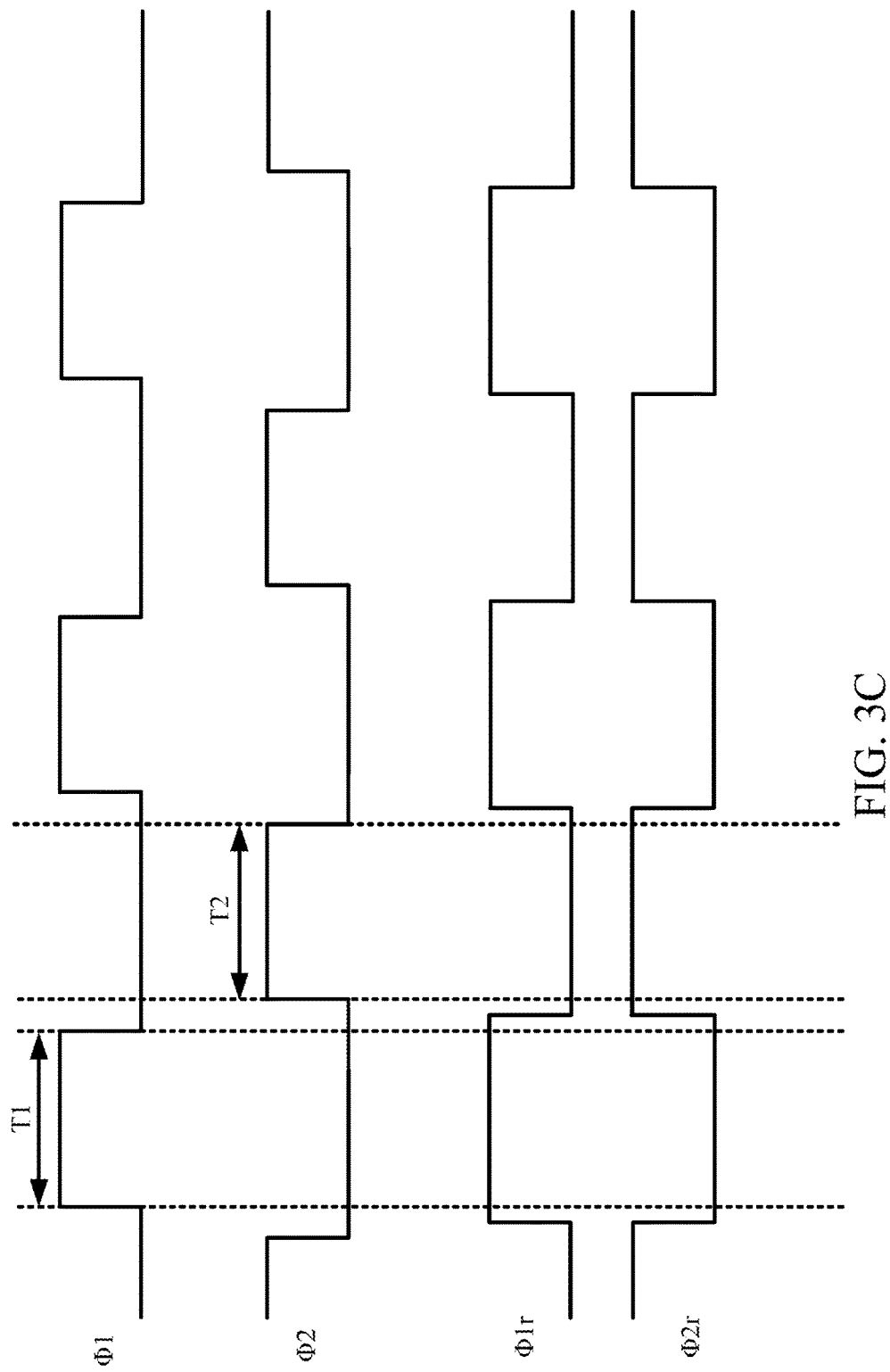

AMPLIFIER AND RESET METHOD THEREOF

CROSS-REFERENCE TO RELATED APPLICATION

This application claims priority to Taiwan Application Serial Number 106130334, filed Sep. 5, 2017, which is herein incorporated by reference.

BACKGROUND

Technical Field

The present disclosure relates to an amplifier. More particularly, the present disclosure relates to an amplifier applied to analog-to-digital converters and a reset method thereof.

Description of Related Art

An amplifier has been widely applied to various electronic devices. For example, the amplifier may be applied to a sample-and-hold circuit of an analog-to-digital converter. In some situations, a Miller capacitor, which is coupled to an output terminal of the amplifier, may be employed to configure the bandwidth and the stability of the amplifier. However, residual charges may be present on this Miller capacitor from the previous operation of the amplifier. As a result, the output signal may be inaccurate or nonlinear. To prevent the above issue, the amplifier is rest before amplifying signals. However, with an increment in the operating speed of the circuits, the present reset mechanism is not sufficient to remove the residual charges in the amplifier completely.

SUMMARY

To address at least problem discussed above, in some aspects, the disclosure provides an amplifier. The amplifier includes an output stage circuit and a compensation circuit. The output stage circuit includes a first input terminal, a second input terminal, a first output terminal, and a second output terminal. The compensation circuit includes a first capacitor, a second capacitor, a third capacitor, and a fourth capacitor. The first capacitor is coupled between the first input terminal and the second output terminal, and is configured to operate as a first Miller capacitor. The second capacitor is coupled between the second input terminal and the first output terminal, and is configured to operate as a second Miller capacitor. The third capacitor and the fourth capacitor are configured to alternately operate as the first Miller capacitor and the second Miller capacitor according to at least one clock signal.

In some aspects, the disclosure provides an amplifier. The amplifier includes an output stage circuit and a compensation circuit. The output stage circuit includes a plurality of input terminals and a plurality of output terminals. The compensation circuit is coupled between the plurality of input terminals and the plurality of output terminals, and is configured to operate as a first Miller capacitor and a second Miller capacitor according to a first clock signal and a second clock signal. The compensation circuit includes a first capacitor, a second capacitor, a third capacitor, and a fourth capacitor. During an enabling period of the first clock signal, the first capacitor and the second capacitor are configured to operate as the first Miller capacitor, and the third capacitor and the fourth capacitor are configured to operate as the second Miller capacitor. During an enabling period of the second clock signal, the first capacitor and the third capacitor are configured to operate as the first Miller capacitor, and the fourth capacitor and the second capacitor are configured to operate as the second Miller capacitor.

In some aspects, the disclosure provides a reset method for resetting an amplifier. The reset method includes following operations: operating, by a first capacitor and a second capacitor, as a first Miller capacitor corresponding to a first output terminal of the amplifier according to a first clock signal; operating, by a third capacitor and a fourth capacitor, as a second Miller capacitor corresponding to a second output terminal of the amplifier according to the first clock signal; operating, by the first capacitor and the fourth capacitor, as the first Miller capacitor corresponding to the first output terminal of the amplifier according to a second clock signal; and operating, by the third capacitor and the second capacitor, as the second Miller capacitor corresponding to the second output terminal of the amplifier according to the second clock signal.

As described above, the amplifier and the reset method of the present disclosure are able to alternately reconfigure the connection between the Miller capacitor and the output terminals of the amplifier, in order to remove the residual charges from the previous operation.

BRIEF DESCRIPTION OF THE DRAWINGS

FIG. 3C is a schematic diagram illustrating waves of the clock signals in FIG. 2 and FIG. 3B, according to some embodiments of the present disclosure.

DETAILED DESCRIPTION

Figure 1:
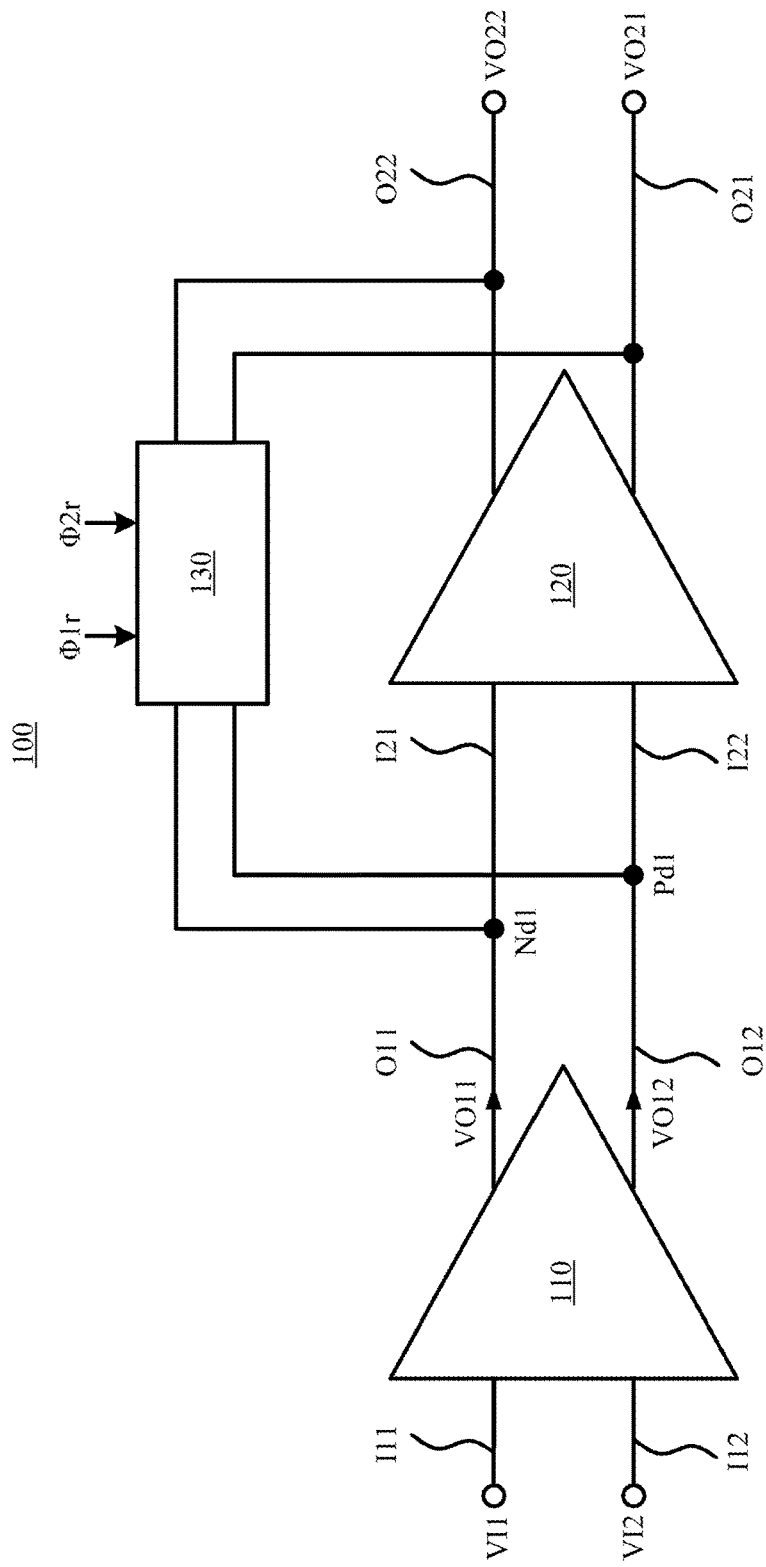
FIG. 1 is a schematic diagram of an amplifier, according to some embodiments of the present disclosure.

Reference is made to FIG. 1. FIG. 1 is a schematic diagram of an amplifier 100, according to some embodiments of the present disclosure. The amplifier 100 includes an input stage circuit 110, an output stage circuit 120, and a compensation circuit 130.

The input stage circuit 110 includes input terminals I11 and I12 and output terminals O11 and O12. The input terminals I11 and I12 receive input signals VI1 and VI2, respectively. In some embodiments, these input signals VI1 and VI2 may be fully-differential input signals. The input stage circuit 110 is configured to provide a first gain to amplify the input signals VI1 and VI2, in order to output output signals VO11 and VO12 via the output terminal O11 and O12 respectively.

The output stage circuit 120 includes input terminals I21 and I22 and output terminals O21 and O22. The input terminal I21 and the output terminal O11 of the input stage circuit 110 are coupled to a node Nd1, in order to receive the output signal VO11. The input terminal I22 and the output terminal O12 of the input stage circuit 110 are coupled to a node Pd1, in order to receive the output signal VO12. The output stage circuit 120 is configured to provide a second gain to amplify the output signals VO11 and VO12, in order to output output signals VO21 and VO22 via the output terminals O21 and O22 respectively.

The compensation circuit 130 is coupled between the input terminals I21 and I22 and the output terminals O21 and O22. The compensation circuit 130 is configured to compensate a frequency response of the amplifier 100, in order to set the stability and the bandwidth of the amplifier 100. For example, in some embodiments, the compensation circuit 130 includes Miller capacitors (which may be, for example, capacitors CN1, CN2, CP1, and CP2 shown in FIG. 3B), in which these Miller capacitors are coupled between the output terminal O22 and O21 and the input terminals I21 and I22.

In some embodiments, a single Miller capacitor may be implemented with parallel-coupled capacitors. In some embodiments, the compensation circuit 130 is further configured to couple these capacitors with each other in a certain time interval according to a clock signal $\Phi 1r$ and a clock signal $\Phi 2r$. With such an arrangement, residual charges, which are left over whenever operating as the Miller capacitor, of these capacitors can be recycled. As a result, in every operation, a voltage level of the output terminal O21 and that of a output terminal O22 can be reset to a predetermined level (e.g., a common mode voltage), in order to increase the linearity and/or the accuracy of the output signals VO21 and VO22. The descriptions regarding here will be given in the following paragraphs with reference to FIGS. 3A-3E.

Figure 2:
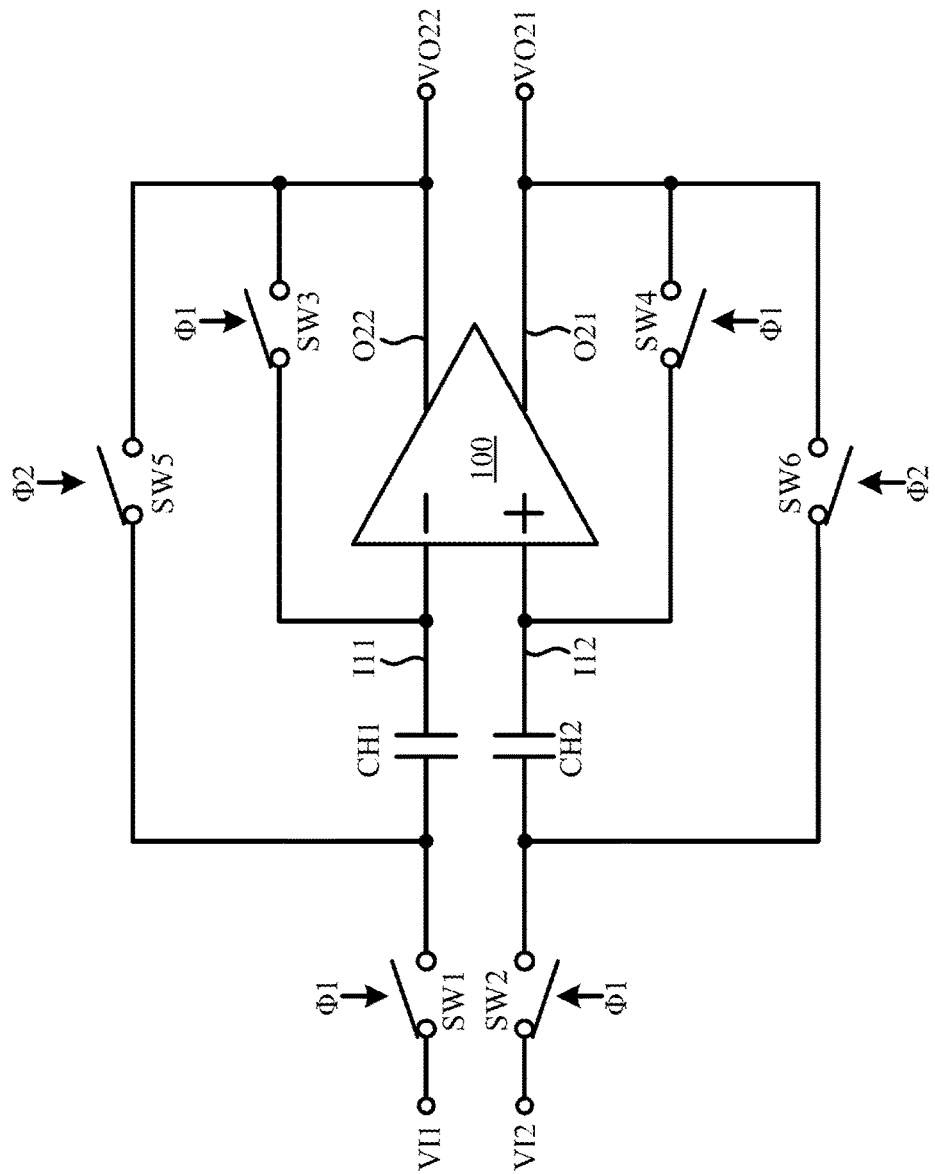
FIG. 2 is a schematic diagram of a switched-capacitor circuit, according to some embodiments of the present disclosure.

Reference is made to FIG. 2. FIG. 2 is a schematic diagram of a switched-capacitor circuit 200, according to some embodiments of the present disclosure. For ease of understanding, like elements in FIG. 2 are designated with the same reference numbers with respect to FIG. 1. In some embodiments, the switched-capacitor circuit 200 may be applied to an analog-to-digital converter. For example, the switched-capacitor circuit 200 may operate as a sample-and-hold circuit or a multiplying DAC. The applications are given for illustrative purposes, but the present disclosure is not limited thereto.

As shown in FIG. 2, the switched-capacitor circuit 200 includes the amplifier 100 in FIG. 1, sampling switches SW1-SW6, and sampling capacitors CH1 and CH2. The sampling switches SW1-SW4 are turned on according to a clock signal $\Phi 1$, and the sampling switches SW5-SW6 are turned on according to a clock signal $\Phi 2$, in order to configure operating modes of the switched-capacitor circuit 200. For example, as shown in FIG. 3C below, in some embodiments, the clock signals $\Phi 1$ and $\Phi 2$ are configured to be non-overlapped clock signals. In other words, an enabling period T1 of the clock signal $\Phi 1$ is not overlapped with an enabling period T2 of the clock signal $\Phi 2$. In some embodiments, the enabling period is a period for the switch being turned on by the clock signal. For ease of illustration, in this document, the enabling period is referred to as a period for the clock signal being at a high level, but the present disclosure is not limited thereto.

During the enabling period T1, the sampling switches SW1-SW4 are turned on, and the sampling switches SW5-SW6 are not turned on. Under this condition, the switched-capacitor circuit 200 is configured to operate in a sampling mode. In the sampling mode, the input signals VI1 and VI2 are sampled to the sampling capacitors CH1 and CH2, respectively. For example, the input signals VI1 and VI2 are differential inputs, and signal values sampled by the sampling capacitors CH1 and CH2 may be expressed as VCM−ΔV and VCM+ΔV, in which VCM is a common mode voltage of the differential inputs, and ΔV is a signal amplitude of the differential inputs.

Then, during the enabling period T2, the sampling switches SW1-SW4 are not turned on, and the sampling switches SW5-SW6 are turned on. Under this condition, the switched-capacitor circuit 200 is configured to operate in a hold mode (or an amplifying mode). In the hold mode, the amplifier 100 amplifies the previous sampled signal values VCM−ΔV and VCM+ΔV, in order to generate the output signals VO21 and VO22.

Ideally, in the hold mode, the output signals VO21 and VO22 generated in every operation should be independent of the output signals VO21 and VO22 generated in the previous sampled mode. However, as the Miller capacitors (not shown) of the amplifier 100 are coupled to the output terminals O21 and O22, the output signals VO21 and VO22 may be stored in these Miller capacitors in the end of the enabling period T1. For example, the Miller capacitors are coupled to the output terminals O21 and O22, and store the residual charges corresponding to the signal values VCM−ΔV and VCM+ΔV which are sampled previously. As such, the output signals VO21 and VO22, which are generated by the amplifier 100 in the subsequent hold mode, may be nonlinear or affected by noises. In some situations, this phenomenon is referred to as an inter-symbol interference (ISI) or a memory effect. In some embodiments, the compensation circuit 130 in FIG. 1 is employed to reduce this phenomenon.

Figure 3A:
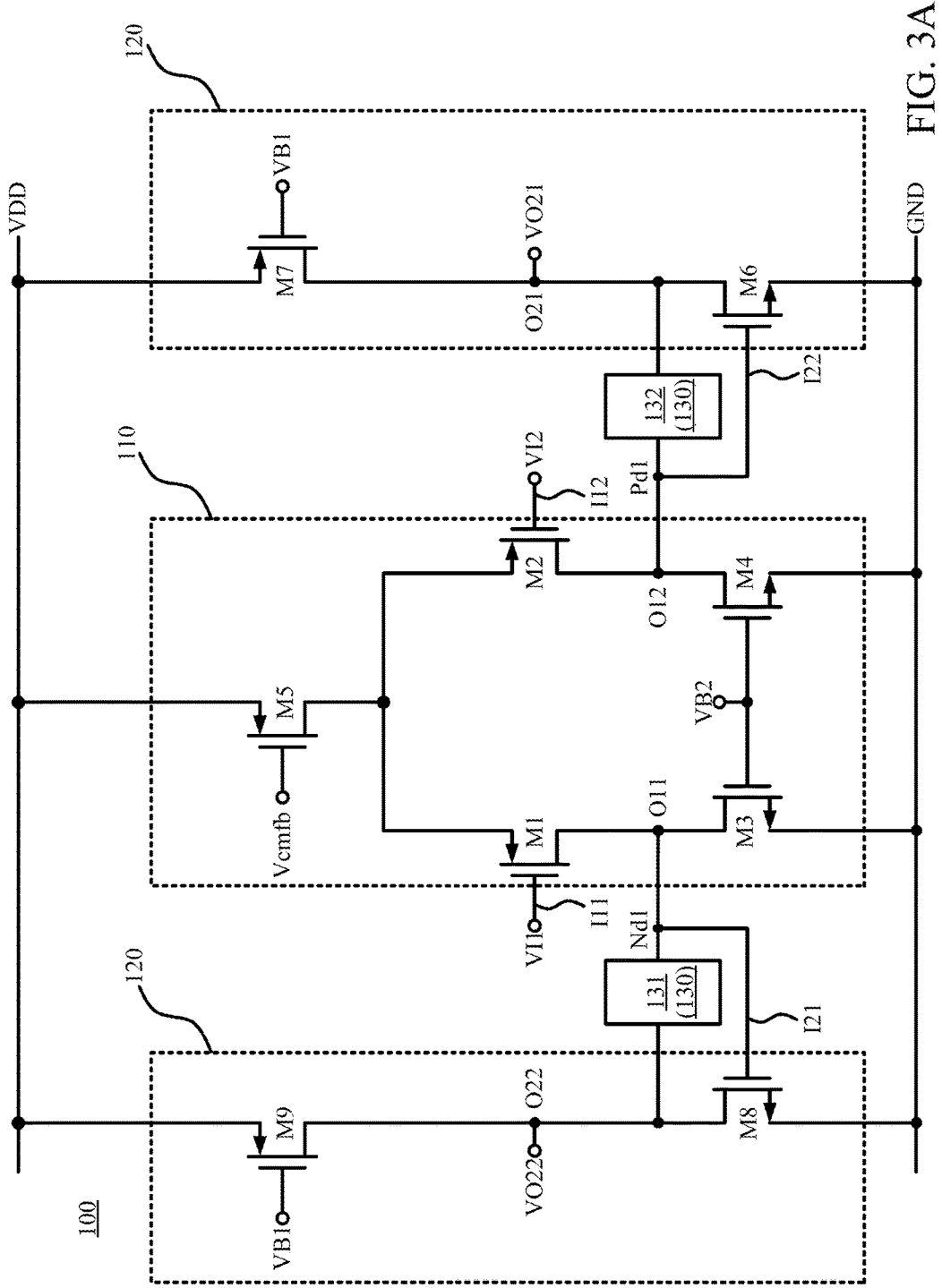
FIG. 3A is a circuit diagram of the amplifier in FIG. 1, according to some embodiments of the present disclosure.

Reference is made to FIG. 3A. FIG. 3A is a circuit diagram of the amplifier 100 in FIG. 1, according to some embodiments of the present disclosure. For ease of understanding, like elements in FIG. 3A are designated with the same reference number with respect to FIG. 1.

As shown in FIG. 3A, the input stage circuit 110 includes transistors M1-M5. A first terminal of the transistor M1 is coupled to a first terminal of the transistor M2, a second terminal of the transistor M1 is configured as the output terminal O11 and is coupled to the node Nd1, and a control terminal of the transistor M1 is configured as the input terminal I11. A second terminal of the transistor M2 is configured as the output terminal O12 and is coupled to the node Pd1, and a control terminal of the transistor M2 is configured as the input terminal I22. A first terminal of the transistor M3 is coupled to the node Nd1, a second terminal of the transistor M3 is coupled to ground GND, and a control terminal of the transistor M3 is configured to receive a bias voltage VB2. A first terminal of the transistor of M4 is coupled to the node Pd1, a second terminal of the transistor M4 is coupled to ground GND, and a control terminal of the transistor M4 is configured to receive the bias voltage VB2. A first terminal of the transistor M5 is configured to receive a voltage VDD, a second terminal of the transistor M5 is coupled to the first terminals of the transistors M1-M2, and a control terminal of the transistor M5 is configured to receive a bias voltage Vcmfb.

In some embodiments, the amplifier 100 further includes a common mode feedback circuit (not shown), which is configured to generate the bias voltage Vcmfb according to the output signals VO21 and VO22, in order to maintain predetermined bias conditions for the amplifier 100.

With continued reference to FIG. 3A, in this example, the compensation circuit 130 includes a capacitive circuit 131 and a capacitive circuit 132. In some embodiments, the capacitive circuit 131 is coupled between the node Nd1 and the output terminal O22 to operate as the Miller capacitor of the amplifier 100, and the capacitive circuit 132 is coupled between the node Pd1 and the output terminal O21 to operate as another Miller capacitor of the amplifier 100.

The output stage circuit 120 includes transistors M6-M9. A first terminal of the transistor M6 is configured as the output terminal O21 and is coupled to a second terminal of the transistor M7 and one terminal of the capacitive circuit 132, a second terminal of the transistor M6 is coupled to ground GND, and a control terminal of the transistor M6 is configured as input terminal I22 which is coupled to the node Pd1 and another terminal of the capacitive circuit 132. A first terminal of the transistor M7 is configured to receive the voltage VDD, and a control terminal of the transistor M7 is configured to receive the bias voltage VB1. A first terminal of the transistor M8 is configured as the output terminal O22 and is coupled to a second terminal of the transistor M9 and one terminal of the capacitive circuit 131, a second terminal of the transistor M8 is coupled to ground GND, and the control terminal of the transistor M8 is configured as the input terminal I21 which is coupled to the node Nd1 and to another terminal of the capacitive circuit 131. A first terminal of the transistor M9 is configured to receive the voltage VDD, and a control terminal of the transistor M9 is configured to receive the bias voltage VB1.

The arrangement shown in FIG. 3A is given for illustrative purposes. Various arrangements of the amplifier 100 are within the contemplated scope of the present disclosure.

Figure 3B:
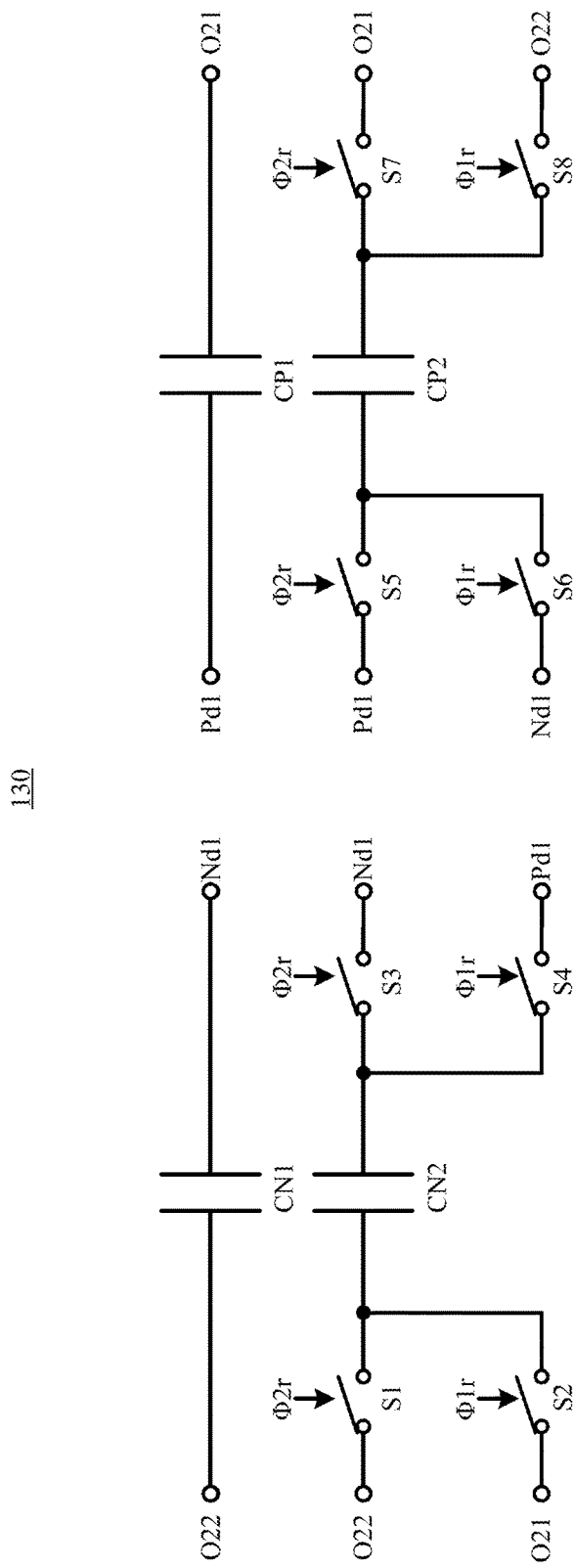
FIG. 3B is a circuit diagram of the compensation circuit in FIG. 1 or FIG. 2, according to some embodiments of the present disclosure.
Figure 3D:
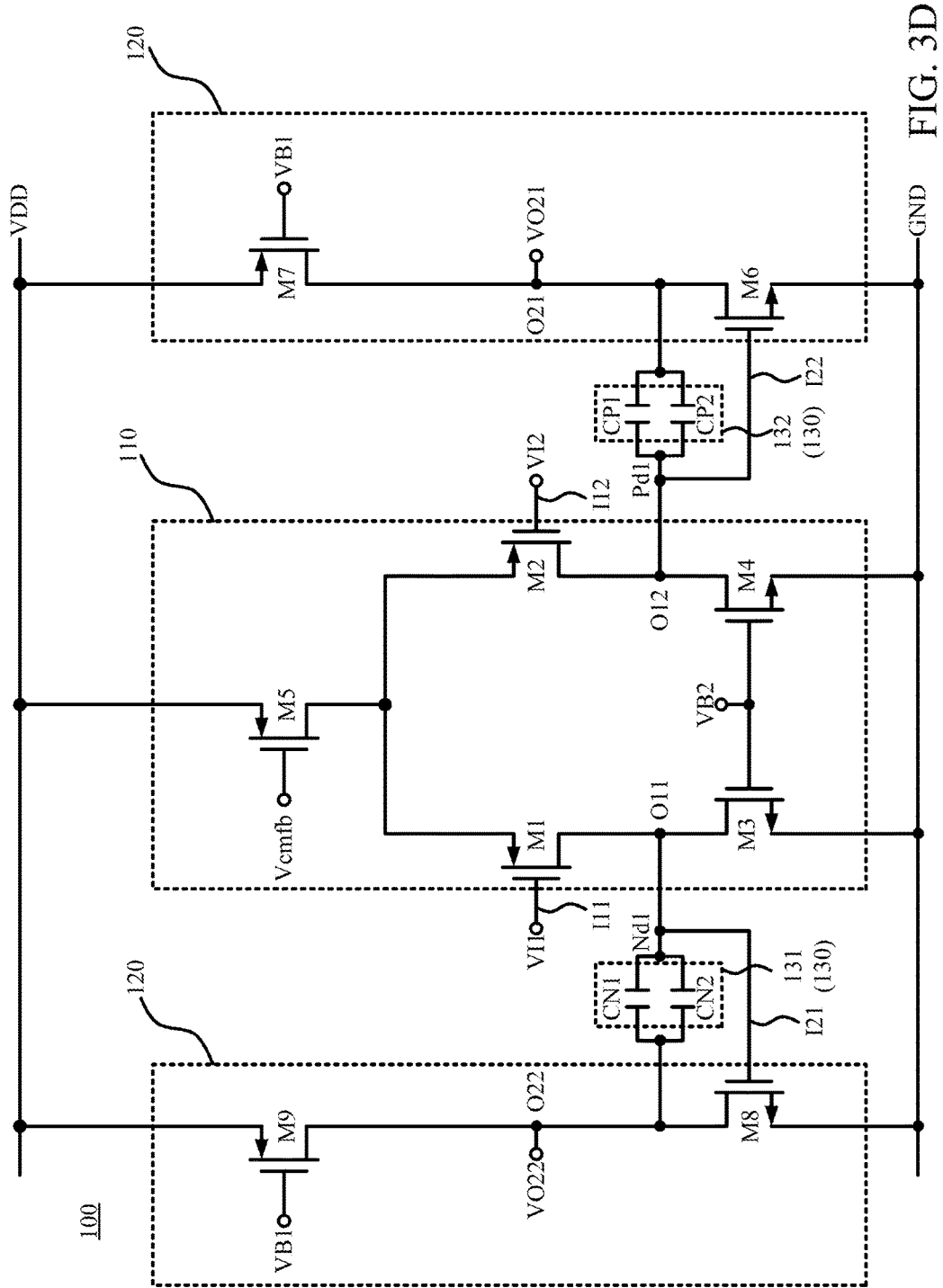
FIG. 3D is a schematic diagram illustrating operations of the amplifier in FIG. 3A while the clock signal in FIG. 3C is at the high level, according to some embodiments of the present disclosure.
Figure 3E:
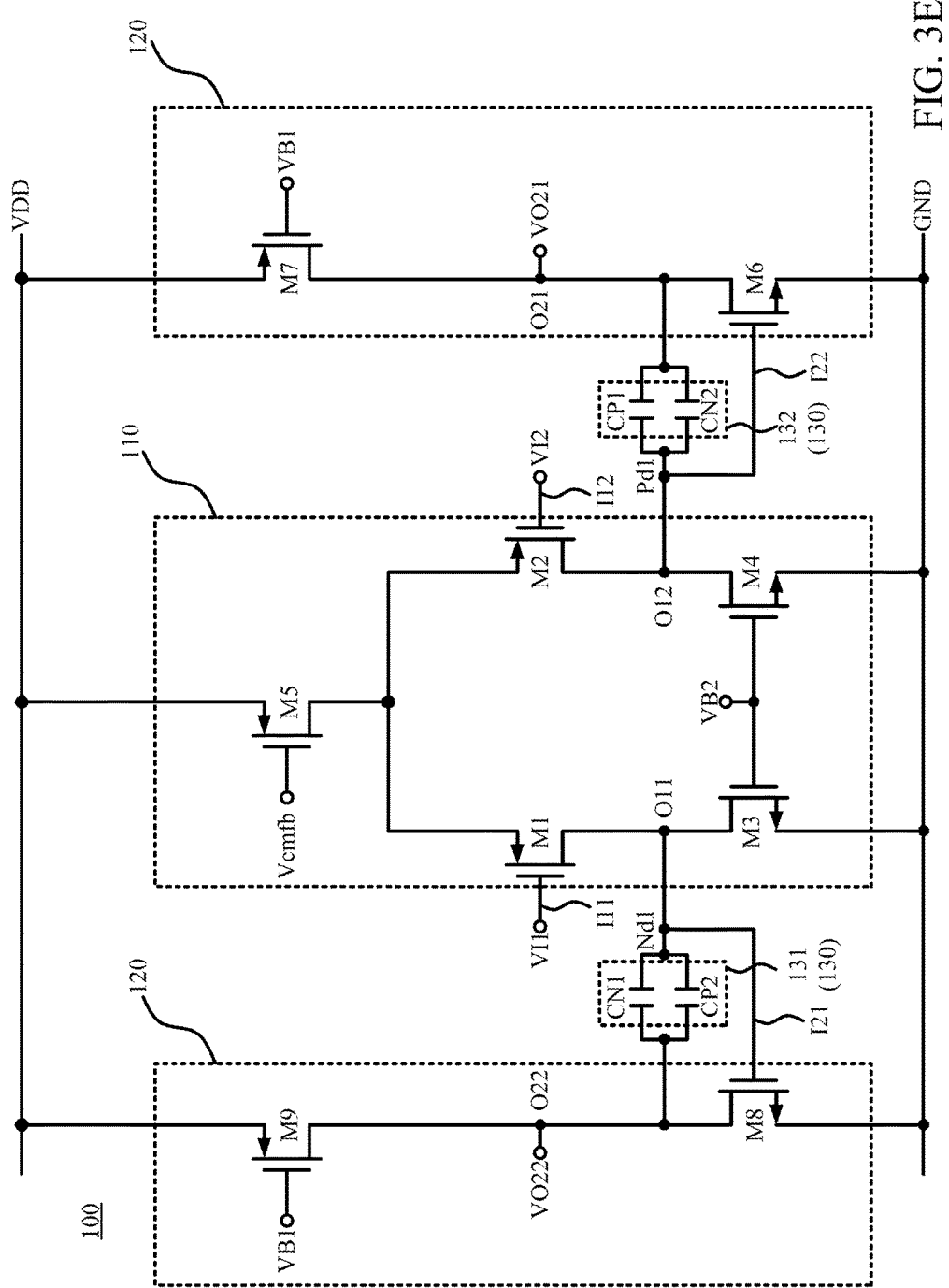
FIG. 3E is a schematic diagram illustrating operations of the amplifier in FIG. 3A while the clock signal in FIG. 3C is at the high level, according to some embodiments of the present disclosure.

Reference is made to FIG. 3B to FIG. 3E. FIG. 3B is a circuit diagram of the compensation circuit 130 in FIG. 1 or FIG. 2, according to some embodiments of the present disclosure. FIG. 3C is a schematic diagram illustrating waves of the clock signals in FIG. 2 and FIG. 3B, according to some embodiments of the present disclosure. FIG. 3D is a schematic diagram illustrating operations of the amplifier 100 in FIG. 3A while the clock signal Φ2r in FIG. 3C is at the high level, according to some embodiments of the present disclosure. FIG. 3E is a schematic diagram illustrating operations of the amplifier 100 in FIG. 3A while the clock signal Φ1r in FIG. 3C is at the high level, according to some embodiments of the present disclosure.

As shown in FIG. 3B, the compensation circuit 130 includes capacitors CN1, CN2, CP1, and CP2, and switches S1-S8. The capacitor CN1 is coupled between the node Nd1 and the output terminal O22. The capacitor CN2 is coupled between terminals of the switches S1 and S2 and terminals of the switches S3 and S4. Another terminal of the switch S1 is coupled to the output terminal O22, and another terminal of the switch S2 is coupled to the output terminal O21. Another terminal of the switch S3 is coupled to the node Nd1, another terminal of the switch S4 is coupled to the node Pd1. The switches S1 and S3 are turned on according to the clock signal Φ2r, and the switches S2 and S4 are turned on according to the clock signal Φ1r.

The capacitor CP1 is coupled between the output terminal O21 and the node Pd1. The capacitor CP2 is coupled between terminals of the switches S5 and S6 and terminals of the switches S7 and S8. Another terminal of the switch S5 is coupled to the node Pd1, and another terminal of the switch S6 is coupled to the node Nd1. Another terminal of the switch S7 is coupled to the output terminal O21, and another terminal of the switch S8 is coupled to the output terminal O22. The switches S5 and S7 are turned on according to the clock signal Φ2r, and the switches S6 and S8 are turned on according to the clock signal Φ1r.

In some embodiments, the capacitors CN1, CN2, CP1, and CP2 are configured to have the same capacitance value. As shown in FIG. 3C, in normal operations, during the enabling period of the clock signal Φ2r (e.g., the period of being high level), the switches S1, S3, S5, and S7 are turned on. Under this condition, as show in FIG. 3D below, the capacitors CN1 and CN2 operate as the capacitive circuit 131, and the capacitors CP1 and CP2 operate as the capacitive circuit 132. Alternatively, as shown in FIG. 3C, during the enabling period of the clock signal Φ1r (e.g., the period of being high level), the switches S2, S4, S6, and S8 are turned on. Under this condition, as shown in FIG. 3E, the capacitors CN1 and CP2 operate as the capacitive circuit 131, and the capacitors CP1 and CN2 operate as the capacitive circuit 132.

As described above, in the end of the enabling period T1 in FIG. 3C, the clock signal Φ1r is still at the high level, and as shown in FIG. 3E, the output signals VO21 and VO22 may be stored in the capacitive circuits 131 and 132, which are coupled to the output terminals O21 and O22 of the amplifier 100. For example, as described above, the residual charges corresponding to VCM+ΔV are stored at the output terminal O22 while the residual charges corresponding to VCM−ΔV are stored at the output terminal O21. In other words, an amount of charges corresponding to +ΔV is present on a terminal, which is coupled to the output terminal O22, of the capacitive circuit 131 (i.e., the capacitors CN1 and CP2), and an amount of charges corresponding to −ΔV is present on a terminal, which is coupled to the output terminal O21, of the capacitive circuit 132 (i.e., the capacitors CP1 and CN2).

Furthermore, reference is also made to FIG. 3D, and during the enabling period of the clock signal Φ2r, the terminal, which is previously coupled to the output terminal O22, of the capacitor CP2 is adjusted to be coupled to the output terminal O21. As such, the capacitor CP2 provides the amount of charges corresponding to +ΔV to the output terminal O22. Effectively, the amount of charges corresponding to −ΔV on the capacitor CP1 are neutralized by the amount of charges corresponding to +ΔV on the capacitor CP2.

Similarly, in the enabling period of the clock signal Φ2r, the terminal, which is previously coupled to the output terminal O21, of the capacitor CN2 is adjusted to be coupled to the output terminal O22. As such, the capacitor CN2 provides the amount of charges corresponding to −ΔV to the output terminal O21. Effectively, the amount of charges corresponding to +ΔV on the capacitor CN1 are neutralized with the amount of charges corresponding to −ΔV on the capacitor CN2. As a result, the levels of the output terminals O21 and O22 of the amplifier 100 are able to be reset to the common mode voltage VCM.

In some embodiments, the period for the clock signal Φ1r or the clock signal Φ2r being at the high level is longer than the period T1 and/or the period T2. In some embodiments, the clock signal Φ1r or the clock signal Φ2r may be a non-overlapped clock signal. The arrangements of the clock signals are given for illustrative purposes, and the present disclosure is not limited thereto.

Figure 4:
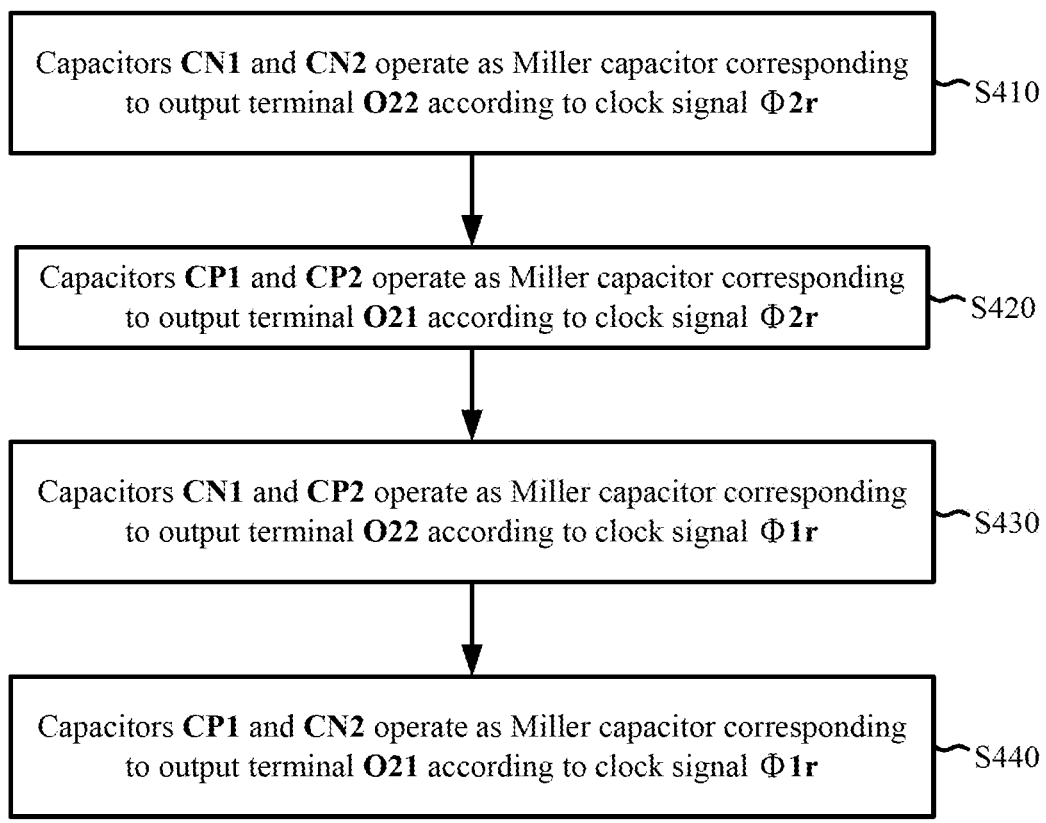
FIG. 4 is a flow chart of a reset method, according to some embodiments of the present disclosure.

Reference is made to FIG. 4. FIG. 4 is a flow chart of a reset method 400, according to some embodiments of the present disclosure. For ease of illustration, reference is also made to FIGS. 3A-3E to illustrate the related operations of the amplifier 100. In some embodiments, the resent method 400 includes operations S410, S420, S430, and S440.

In operation S410, the capacitors CN1 and CN2 operate as the Miller capacitor corresponding to the output terminal O22 according to the clock signal Φ2r. In operation S420, the capacitors CP1 and CP2 operate as the Miller capacitor corresponding to the output terminal O21 according to the clock signal Φ2r.

For illustration, as shown in FIGS. 3A-3C, during the enabling period of the clock signal Φ2r, the switches S1 and S3 are turned on, and the switches S5 and S7 are turned on. As a result, as shown in FIG. 3D, the capacitive circuit 131, which is formed by the capacitors CN1 and CN2, is coupled between the output terminal O22 and the node Nd1, in order to operate as the Miller capacitor corresponding to the output terminal O22. Meanwhile, the capacitive circuit 132, which is formed by the capacitors CP1 and CP2, is coupled between the output terminal O21 and the node Pd1, in order to operate as the Miller capacitor corresponding to the output terminal O21.

With continued reference to FIG. 4, in operation S430, the capacitors CN1 and CP2 operate as the Miller capacitor corresponding to the output terminal O22 according to the clock signal Φ1r. In operation S440, the capacitors CP1 and CN2 operate as the Miller capacitor corresponding to the output terminal O21 according to the clock signal Φ1r.

For illustration, as shown in FIGS. 3B, 3C, and 3E, during the enabling period of the clock signal Φ1r, the switches S2 and S4 are turned on, and the switches S6 and S8 are turned on. As a result, the capacitive circuit 131, which is formed by the capacitors CN1 and CP2, is coupled between the output terminal O22 and the node Nd1, in order to operate as the Miller capacitor corresponding to the output terminal O22. Meanwhile, the capacitive circuit 132, which is formed by the capacitors CP1 and CN2, is coupled between the output terminal O21 and the node Pd1, in order to operate as the Miller capacitor corresponding to the output terminal O21. In addition, as described above, the output terminals O21 and O22 of the amplifier 100 can be reset under this condition.

The above description of the reset method 400 includes exemplary operations, but the operations of the reset method 400 are not necessarily performed in the order described above. The order of the operations of the reset method 400 can be changed, or the operations can be executed simultaneously or partially simultaneously as appropriate, in accordance with the spirit and scope of various embodiments of the present disclosure.

As described above, the amplifier and the reset method of the present disclosure are able to alternately reconfigure the connection between the Miller capacitor and the output terminals of the amplifier, in order to remove the residual charges from the previous operation.

It will be apparent to those skilled in the art that various modifications and variations can be made to the structure of the present disclosure without departing from the scope or spirit of the disclosure. In view of the foregoing, it is intended that the present disclosure cover modifications and variations of this disclosure provided they fall within the scope of the following claims.

What is claimed is:

1. An amplifier, comprising:
   an output stage circuit comprising a first input terminal, a second input terminal, a first output terminal, and a second output terminal; and
   a compensation circuit comprising:
   a first capacitor coupled between the first input terminal and the second output terminal, the first capacitor configured to operate as a first Miller capacitor;
   a second capacitor coupled between the second input terminal and the first output terminal, the second capacitor configured to operate as a second Miller capacitor;
   a third capacitor configured to be coupled in parallel with the first capacitor and to be coupled in parallel with the second capacitor by turns, in order to operate as one of the first Miller capacitor and the second Miller capacitor according to at least one clock signal; and
   a fourth capacitor configured to be coupled in parallel with the second capacitor and to be coupled in parallel with the first capacitor by turns, in order to operate as another one of the first Miller capacitor and the second Miller capacitor according to the at least one clock signal.

2. The amplifier of claim 1, wherein the compensation circuit further comprises:
   a first group of switches configured to be turned on according to a first clock signal of the at least one clock signal to couple the third capacitor between the first input terminal and the second output terminal, in order to cooperate with the first capacitor to operate as the first Miller capacitor; and
   a second group of switches configured to be turned on according to the first clock signal to couple the fourth capacitor between the second input terminal and the first output terminal, in order to cooperate with the second capacitor to operate as the second Miller capacitor.

3. The amplifier of claim 2, wherein the first group of switches comprises a first switch and a second switch, the second group of switches comprises a third switch and a fourth switch, the first switch is coupled between the third capacitor and the second output terminal and is configured to be turned on according to the first clock signal, the second switch is coupled between the third capacitor and the first input terminal and is configured to be turned on according to the first clock signal, the third switch is coupled between the fourth capacitor and the second input terminal and is configured to be turned on according to the first clock signal, and the fourth switch is coupled between the fourth capacitor and the first output terminal and is configured to be turned on according to the first clock signal.

4. The amplifier of claim 2, wherein the compensation circuit further comprises:
   a third group of switches configured to be turned on according to a second clock signal of the at least one clock signal to couple the third capacitor between the second input terminal and the first output terminal, in order to cooperate with the second capacitor to operate as the second Miller capacitor; and
   a fourth group of switches configured to be turned on according to the second clock signal to couple the fourth capacitor between the first input terminal and the second output terminal, in order to cooperate with the first capacitor to operate as the first Miller capacitor.

5. The amplifier of claim 4, wherein the third group of switches comprises a first switch and a second switch, the fourth group of switches comprises a third switch and a fourth switch, the first switch is coupled between the third capacitor and the first output terminal and is configured to be turned on according to the second clock signal, the second switch is coupled between the third capacitor and the second input terminal and is configured to be turned on according to the second clock signal, the third switch is coupled between the fourth capacitor and the first input terminal and is configured to be turned on according to the second clock signal, and the fourth switch is coupled between the fourth capacitor and the second output terminal and is configured to be turned on according to the second clock signal.

6. The amplifier of claim 4, further comprising:
an input stage circuit comprising a third input terminal, a fourth input terminal, a third output terminal, and a fourth output terminal,
wherein the third input terminal is configured to receive a first input signal, the fourth input terminal is configured to receive a second input signal, the third output terminal is coupled to the first input terminal, and the fourth output terminal is coupled to the second input terminal.

7. The amplifier of claim 6, further comprising:
a plurality of sampling switches; and
a plurality of sampling capacitors, coupled to the third input terminal, the fourth input terminal, the first output terminal, and the second output terminal,
wherein the plurality of sampling switches are turned on according to a third clock signal and a fourth clock signal, in order to operate in a first mode or a second mode with the plurality of sampling capacitors, when operating in the first mode, the plurality of sampling capacitors are configured to sample the first input signal and the second input signal, respectively, and when operating in the second mode, the input stage circuit and the output stage circuit are configured to amplify the sampled first input signal and the sampled second input signal.

8. The amplifier of claim 7, wherein an enabling period of the first clock signal or the second clock signal is longer than an enabling period of the third clock signal or the fourth clock signal.

9. The amplifier of claim 2, wherein the first capacitor, the second capacitor, the third capacitor, and the fourth capacitor have the same capacitance values.

10. An amplifier, comprising:
an output stage circuit comprising a plurality of input terminals and a plurality of output terminals; and
a compensation circuit coupled between the plurality of input terminals and the plurality of output terminals, the compensation circuit configured to operate as a first Miller capacitor and a second Miller capacitor according to a first clock signal and a second clock signal,
wherein the compensation circuit comprises a first capacitor, a second capacitor, a third capacitor, and a fourth capacitor, during an enabling period of the first clock signal, the first capacitor and the second capacitor are configured to operate as the first Miller capacitor, and the third capacitor and the fourth capacitor are configured to operate as the second Miller capacitor, and during an enabling period of the second clock signal, the first capacitor and the third capacitor are configured to operate as the first Miller capacitor, and the fourth capacitor and the second capacitor are configured to operate as the second Miller capacitor.

11. The amplifier of claim 10, wherein the first capacitor, the second capacitor, the third capacitor, and the fourth capacitor have the same capacitance values.

12. The amplifier of claim 10, wherein the first capacitor is coupled between a first input terminal of the plurality of input terminals and a first output terminal of the plurality of output terminals, the fourth capacitor is coupled between a second input terminal of the plurality of input terminals and a second output terminal of the plurality of output terminals, and the compensation circuit further comprises:

a first switch configured to be turned on according to the first clock signal, in order to couple the second capacitor to the first input terminal;
a second switch configured to be turned on according to the first clock signal, in order to couple the second capacitor to the first output terminal;
a third switch configured to be turned on according to the second clock signal, in order to couple the second capacitor to the second input terminal; and
a fourth switch configured to be turned on according to the second clock signal, in order to couple the second capacitor to the second output terminal.

13. The amplifier of claim 12, wherein the compensation circuit further comprises:
a fifth switch configured to be turned on according to the first clock signal, in order to couple the third capacitor to the second input terminal;
a sixth switch configured to be turned on according to the first clock signal, in order to couple the third capacitor to the second output terminal;
a seventh switch configured to be turned on according to the second clock signal, in order to couple the third capacitor to the first input terminal; and
an eighth switch configured to be turned on according to the second clock signal, in order to couple the third capacitor to the first output terminal.

14. The amplifier of claim 10, further comprising:
an input stage circuit configured to amplify a first input signal and a second input signal, and transmit the amplified first input signal and the amplified second input signal to the plurality of input terminals of the output stage circuit.

15. The amplifier of claim 14, further comprising:
a plurality of sampling switches; and
a plurality of sampling capacitors, coupled to the input stage circuit,
wherein the plurality of sampling switches are turned on according to a third clock signal and a fourth clock signal, in order to operate in a first mode or a second mode with the plurality of sampling capacitors, when operating in the first mode, the plurality of sampling capacitors are configured to sample the first input signal and the second input signal, respectively, and when operating in the second mode, the input stage circuit and the output stage circuit are configured to amplify the sampled first input signal and the sampled second input signal.

16. A reset method for resetting an amplifier, the reset method comprising:
operating, by a first capacitor and a second capacitor, as a first Miller capacitor corresponding to a first output terminal of the amplifier according to a first clock signal;
operating, by a third capacitor and a fourth capacitor, as a second Miller capacitor corresponding to a second output terminal of the amplifier according to the first clock signal;
operating, by the first capacitor and the fourth capacitor, as the first Miller capacitor corresponding to the first output terminal of the amplifier according to a second clock signal; and
operating, by the third capacitor and the second capacitor, as the second Miller capacitor corresponding to the second output terminal of the amplifier according to the second clock signal.

17. The reset method of claim 16, wherein the amplifier further comprises a first input terminal and a second input terminal, and operating, by the first capacitor and the second capacitor, as the first Miller capacitor comprises:

turning on a first group of switches according to the first clock signal to couple the second capacitor between the second input terminal and the first output terminal, in order to cooperate with the first capacitor to operate as the first Miller capacitor, wherein the first capacitor is coupled between the second input terminal and the first output terminal.

18. The reset method of claim 17, wherein operating, by the third capacitor and the fourth capacitor, as the second Miller capacitor comprises:

turning on a second group of switches according to the first clock signal to couple the fourth capacitor between the first input terminal and the second output terminal, in order to cooperate with the third capacitor to operate as the second Miller capacitor, wherein the third capacitor is coupled between the first input terminal and the second output terminal.

19. The reset method of claim 18, wherein operating, by the first capacitor and the fourth capacitor, as the first Miller capacitor comprises:

turning on a third group of switches according to the second clock signal to couple the fourth capacitor between the second input terminal and the first output terminal, in order to cooperate with the first capacitor to operate as the first Miller capacitor.

20. The reset method of claim 18, wherein operating, by the third capacitor and the second capacitor, as the second Miller capacitor comprises:

turning on a fourth group of switches according to the second clock signal to couple the second capacitor between the first input terminal and the second output terminal, in order to cooperate with the third capacitor to operate as the second Miller capacitor.

* * * * *